United States Patent [19]
Kim et al.

[11] Patent Number: 5,808,948
[45] Date of Patent: Sep. 15, 1998

[54] SEMICONDUCTOR MEMORY DEVICE

[75] Inventors: Chul-soo Kim, Suwon; Ho-cheol Lee, Seoul, both of Rep. of Korea

[73] Assignee: Samsung Electronics, Co., Ltd., Suwon, Rep. of Korea

[21] Appl. No.: 769,615

[22] Filed: Dec. 18, 1996

[30] Foreign Application Priority Data

Dec. 30, 1995 [KR] Rep. of Korea .................. 95/69724

[51] Int. Cl.⁶ .................................................. G11C 7/00
[52] U.S. Cl. .................. 365/201; 365/200; 365/230.03
[58] Field of Search .................................. 365/200, 201, 365/230.03

[56] References Cited

U.S. PATENT DOCUMENTS 5,576,999  11/1996  Kim et al. ........................ 365/200
5,619,460  4/1997   Kirihata et al. .................. 365/251

*Primary Examiner*—A. Zarabian
*Attorney, Agent, or Firm*—Marger, Johnson, McCollom & Stolowitz P.C.

[57] ABSTRACT

There is provided a semiconductor memory device which does not require an additional input pad to apply a signal for discriminating between a normal cell and a redundant cell. The semicodnuctor memory device has (claim 1). Therefore, the normal cell array or the redundant cell array is sequentially selected and tested by using the same input pad to which the bank select bit is input, without an additional pad.

11 Claims, 4 Drawing Sheets

SEMICONDUCTOR MEMORY DEVICE

BACKGROUND OF THE INVENTION

The present invention relates to a semiconductor memory device, and more particularly, to a semiconductor memory device that does not require an additional pad for discriminating between normal cells and redundant cells during testing.

Generally, a memory cell array. in a memory device comprises a normal cell array and a redundant cell array. In testing a memory device according to the prior art, only the normal cell is initially tested. If a repairable failure is found, the cell is repaired. The cell is then retested, and memory device assembled if it passes the test.

However, there are some cases where a redundant cell is susceptible to a failure despite a repair. Thus, efforts have recently been made to reduce the possibility of a post-repair failure by repairing only redundant cells that pass initial tests.

FIG. 1 is a schematic block diagram of a conventional memory device for enabling redundant cell testing. The conventional memory device has a memory cell array 24, address input pads 10 (PAO–PA13), a row address buffer 12, row decoding means 14, redundancy decoding means 16, a column address buffer 18, column decoding means 20, and redundancy column decoding means 22.

The memory cell array 24 is divided into a normal cell array defined by RA13B and CA13B and a redundant cell array defined by RA13 and CA 13. Address input pads PA0–PA12 are connected to external pins that are applied during a package process. Address input pad PA13 is only used during testing. The row address buffer 12 buffers row address signals input via the address input pads PA0–PA13. The row decoding means 14 and the redundancy row decoding means 16 decode the row addresses. The row decoding means 14 decodes addresses for the normal cell array and the redundancy row decoding means 16 decodes addresses for the redundant cell array. The column address buffer 18 buffers column addresses on the address input pads PA0–PA13. The column decoding means 20 decodes addresses for the normal cell array and the redundancy column decoding means 22 decodes addresses for the redundant cell array.

In conventional memory devices, addresses needed for normal addressing are applied to the pads PA0–PA12. However, to test both the normal and redundant cell arrays, an additional signal is required to discriminate between the normal cell array and the redundant cell array. The signal is applied on pad PA13. That is, to test the normal cell array, defined by RA13B and CA13B, and the redundant cell array, defined by RA13 and CA13, a signal is either asserted or deasserted on the address input pad PA13. The normal cell array is selected when the most significant bit (MSB) of the address input on input pad PA13 is logic "0". If the MSB is logic "1", the redundant cell array is selected.

When an address is received on the address input pads 10 (PA0–PA13), the row address buffer 12 and the column address buffer 18 buffer the address. If the address selects the normal cell, that is, if the MSB of the address is logic "0", a row predecoder 14a and a column predecoder 20a are activated. The row decoder 14a and column decoder 20b receive and decode the outputs of the row predecoder 14a and the column predecoder 20a selecting the normal cell defined by RAI3B and CA13B.

If the signal applied to the address input pad PA13 is logic "1", that is, if the redundant cell is to be tested, a redundancy row fuse box 16a and a redundancy column fuse box 22a are activated. The redundancy row decoder 16b and the redundancy column decoder 22b receive and decode the outputs of the redundancy row fuse box 16a and the redundancy column fuse box 22b, respectively, selecting the redundant cell, defined by RA13 and CA13.

Thus, the semiconductor memory device shown in FIG. 1 needs an additional address input pad for applying a signal that switches between normal cells and redundant cells in a test mode, in addition to the address input pads used in the normal operating mode. A probe card used for testing the semiconductor device must include an additional input pin that corresponds to the additional address input pad PA 13.

SUMMARY OF THE INVENTION

An object of the invention is to provide a semiconductor memory device that does not require an additional address pad for accessing both normal cells and redundant cells during testing.

A semiconductor memory device includes a plurality of banks each having normal and redundant cell arrays. One of the banks is selected in response to an external input bank select bit. A test mode determining means receives an external address and generates a test mode signal in response to external control signals. A redundant cell test controller selects one of the normal and redundant cell arrays of the selected bank in response to the bank select bit and the test mode signal.

A first control signal comprises an external row address strobe signal. A second control signal is a logical combination of an external chip select signal, column address strobe signal, and write enable signal.

The test mode determining means includes a first transferring means for transferring the address in response to the first control signal. A first latch stores the address transferred from the first transferring means. A first inverter inverts the output of the first latch. A second transferring means transfers an output signal from the first inverter in response to the second control signal. A second latch stores a signal transferred by the second transferring means. A second inverter inverts an output signal from the second latch and outputs the test mode signal. A first precharge circuit precharges an input of the first latch. A second precharge circuit precharges an input of the second latch.

The test mode determining means and redundant cell test controlling means reduce the number of address pads required for testing redundant memory cells.

The foregoing and other objects, features and advantages of the invention will become more readily apparent from the following detailed description of a preferred embodiment of the invention which proceeds with reference to the accompanying drawings.

DETAILED DESCRIPTION OF THE INVENTION

Figure 1:
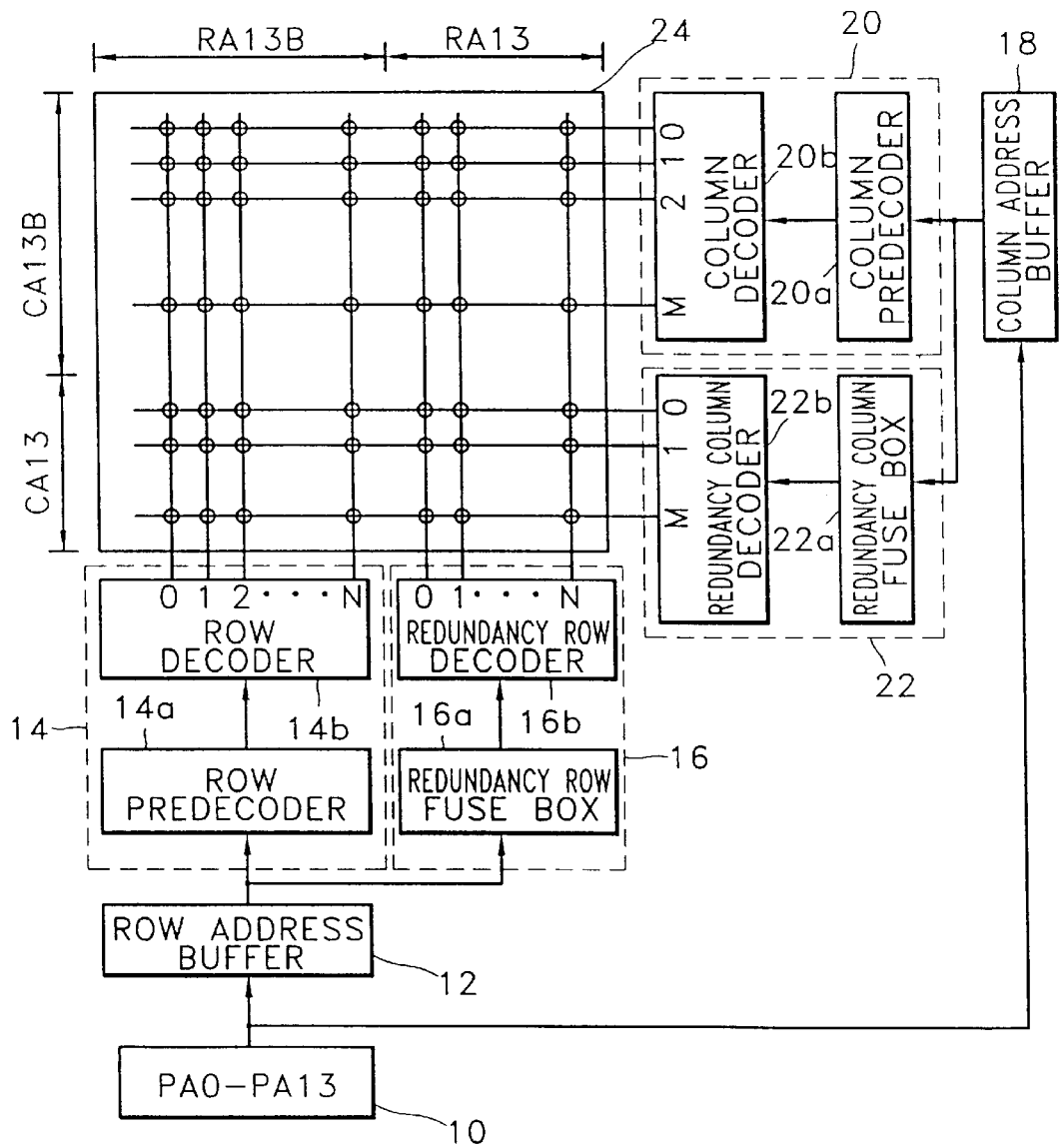
FIG. 1 is a block diagram of a conventional memory device for enabling redundant cell testing.
Figure 2:
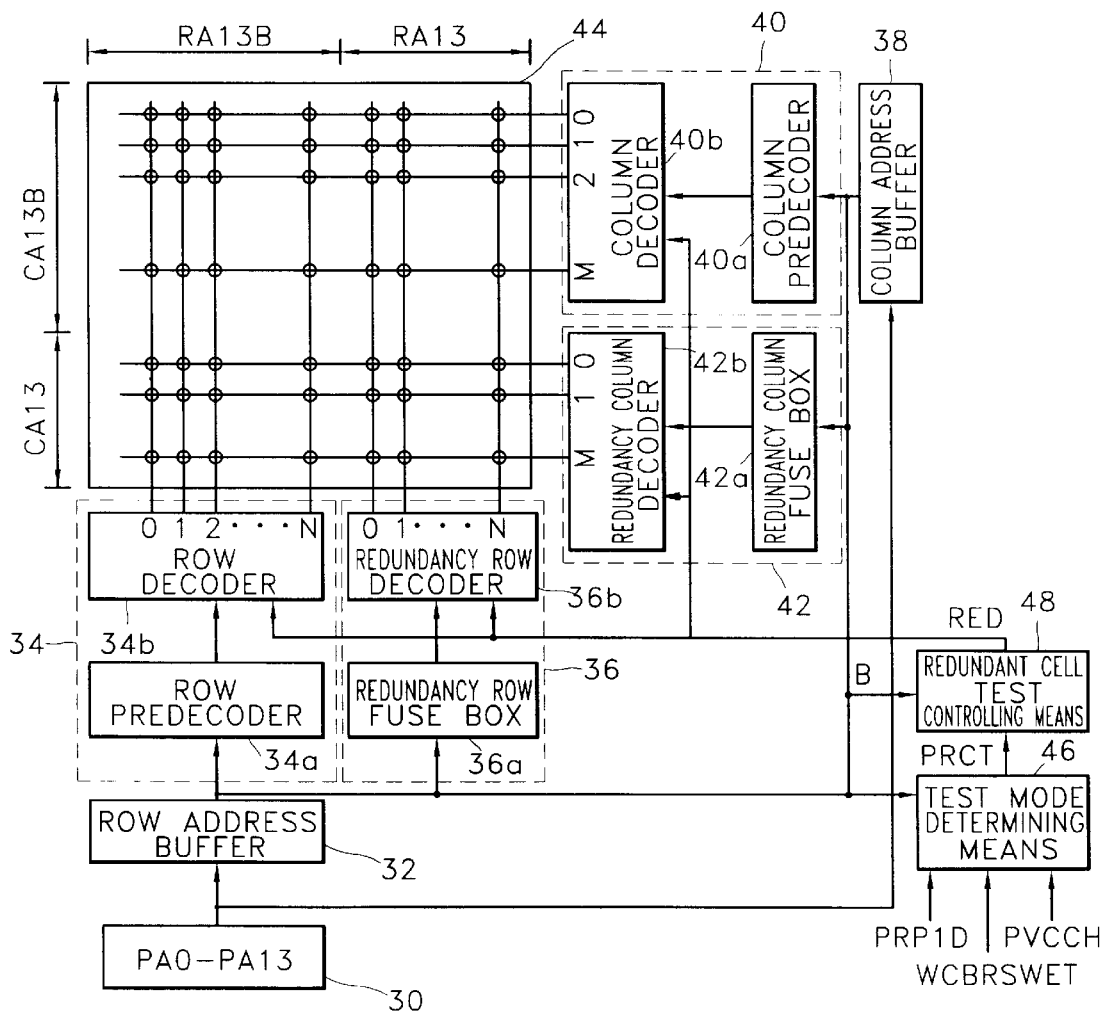
FIG. 2 is a block diagram of a memory device that enables redundant cell testing according to the present invention.

Referring to FIG. 2, a semiconductor memory device according to the present invention includes a memory cell array 44 having a normal cell array defined by RA13B and CA13B and a redundant cell array defined by RA13 and CA13. Address input pads 30 (PA0–PA13) receive externally applied addresses. A row address buffer 32 buffers a row address for the address input on the address input pads 30 (PA0–PA13). Either row decoding means 34 or redundancy row decoding means 36 are activated in response to a redundancy control signal RED. The row decoding means 34 address row lines for the normal cell array of the RA13B and CA13B areas. The redundant row decoding means 36 address the row lines for the redundant cell array of the RA13 and CA13 areas.

A column address buffer 38 buffers a column address among the addresses input on the address input pads 30 (PA0–PA13). Column decoding means 40 address column lines of the normal cell array RA13B and CA13B and the redundancy column decoding means 42 address the column lines of the redundant cell array RA13 and CA13. A test mode determining means 46 receives an address or a combination of addresses and generates a test mode signal PRCT indicating the initiation of a test mode. The PRCT signal is generated in response to control signals PRP1D, WCBRSET, and PVCCH. A redundant cell test controlling means 48 generates the redundancy control signal RED in response to a bank select bit B of the address and the test mode signal PRCT.

The memory cell array 44 has a plurality of banks, one of which is selected in response to the bank select bit B of the address. The row decoding means 34 includes a row predecoder 34$a$ for predecoding a row address from the row address buffer 32. A row decoder 34$b$ is activated in response to the redundancy control signal RED, redecodes an output signal of the row predecoder 34$a$, and addresses a row of the normal cell array RA13B and CA13B. The redundancy row decoding means 36 includes a row fuse box 36$a$ which is activated when the row address is selected for the redundant cell. A redundancy row decoder 36$b$ is activated in response to the redundancy control signal RED, redecodes an output signal of the redundancy row fuse box 36$a$, and addresses a row line of the redundant cell array of RA13 and CA13.

The column decoding means 40 includes a column predecoder 40$a$ that predecodes a column address input from the column address buffer 38. A column decoder 40$b$ is activated in response to the redundancy control signal RED, redecodes an output signal from the column predecoder 40$a$, and addresses a column line of the normal cell array of RA13B and CA13B. The redundancy column decoding means 42 includes a redundancy column fuse box 42$a$ which is activated when the column address selects the redundant cell. A redundancy column decoder 42$b$ is activated in response to the redundancy control signal RED, re-decoding an output signal of the redundancy column fuse box 42$a$, and addressing a column line of the redundant cells RA13 and CA13.

The first control signal PRP1D is a pulse signal which is enabled by an external input row address strobe signal$_{RAS}$, the second control signal WCBRSET is a combination signal of a chip select signal$_{cs}$, a column address strobe signal $_{CAS}$, and a write enable signal $_{WE}$. The third control signal PVCCH is a precharge signal.

Figure 3:
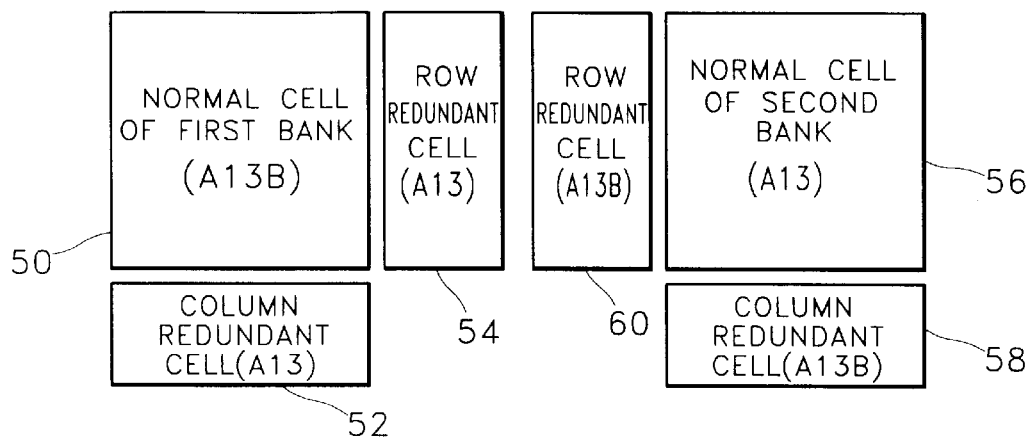
FIG. 3 is a block diagram showing memory cell addressing for the memory device shown in FIG. 2.

FIG. 3 is a block diagram that shows memory cells for the semiconductor memory device in FIG.2. The memory cells 44 of FIG. 2 have two banks. The MSB of the address input from the input pad A13 is used as a bank select bit. A normal cell 50 for a first bank 50 in the memory cell array is selected when the MSB of the address is at a "low" level (A13B). Row and column redundant cells 52 and 54 for the first bank are selected when the MSB of the address is at a "high" level (A13).

A normal cell 56 for a second bank is selected when the MSB of the address is at a "high" level (A13). Row and column redundant cells 60 and 58 for the second bank are selected when the MSB of the address is at a "low" level (A13B).

Figure 4:
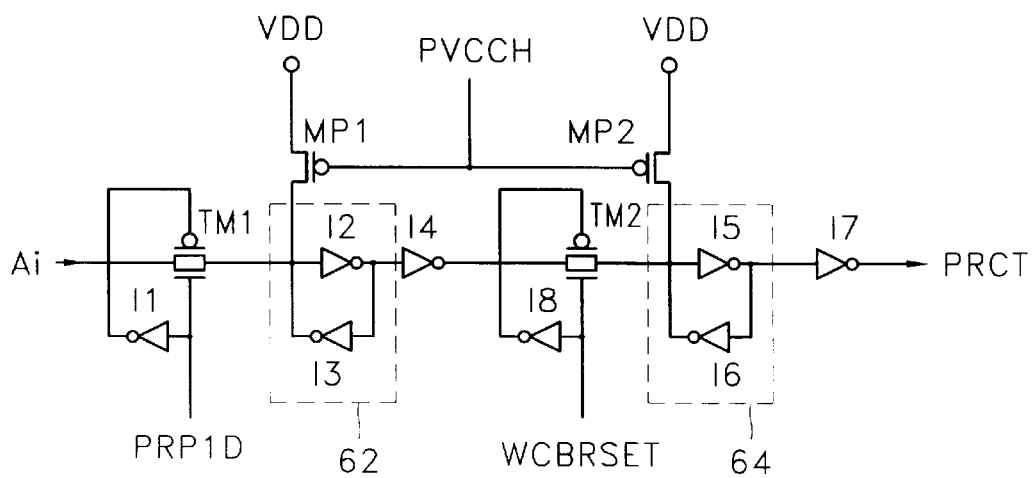
FIG. 4 is a detailed circuit diagram of a test mode determining means for the memory device shown FIG. 2.

FIG. 4 is a detailed circuit diagram of the test mode determining means for the semiconductor memory device of the present invention shown in FIG. 2. A transfer means TM1 transfers an address or address combination signal Ai in response to the first control signal PRP1D. A latch 62 stores a signal transferred by the transferring means TM1. Inverting means I4 inverts an output signal of the latch 62. Transfer means TM2 transfers an output signal of the inverting means I4 in response to the second control signal WCBRSET. A latch 64 stores the signal transferred by the transferring means TM2. Inverting means I7 inverts an output signal of the latch 64 and outputs a test mode signal PRCT that sets a test mode.

Precharge means MP1 precharges an input terminal of the latch 62 in response to the third control signal PVCCH. Precharge means MP2 precharges an input terminal of the latch 64. The transfer means TM1 comprises a transmission gate and is activated when control signal PRP1D is logic "high". The transferring means TM2 comprises a transmission gate activated when control signal WCBRSET is logic "high". The latch 62 comprises two inverters I2 and I3 and the latch 64 comprises two inverters I5 and I6. The inverting means I4 and I7 each comprise inverters. The precharge means MP1 and MP2 each comprise PMOS transistors.

Figure 5:
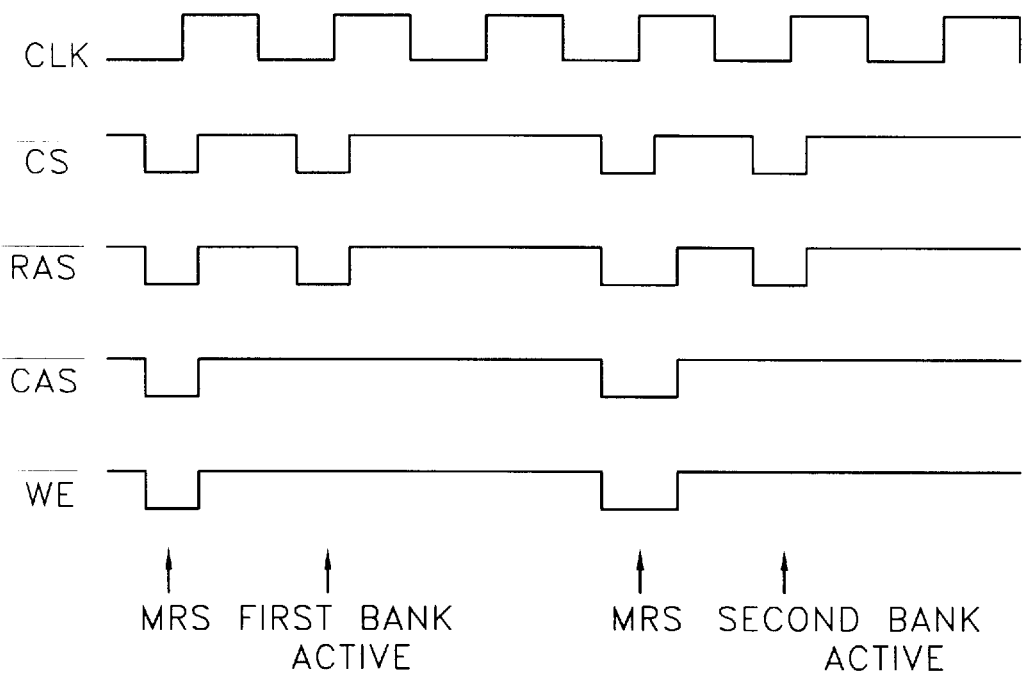
FIG. 5 is a timing diagram for testing a memory cell array for the semiconductor memory device shown in FIG. 2.

FIG. 5 is a timing diagram showing how the memory cell array of the semiconductor memory device shown in FIG. 2 is tested. The chip selecting signal$_{CS}$, the row address strobe signal$_{RAS}$, the column address strobe signal $_{CAS}$, the write enable signal$_{WE}$, and the clock signal CLK are all input at "low" levels to the memory device of FIG. 2. In a mode register set (MRS) cycle, the first and second control signals PRP1D and WCBRSET of FIG. 4 are driven "high". The test mode signal PRCT is activated by an address or address combination Ai (FIG. 4). If a bank select bit B, which is the MSB (A13) of an address input during the MRS cycle, is high, the first bank of FIG. 3 is selected. When the bank select bit B is "low", the second bank of FIG. 3 is selected.

After the MRS cycle, when the chip select signal$_{cs}$ and the row address strobe signal $_{RAS}$ are driven to low levels, and the column address strobe signal$_{CAS}$ and the write enable signal$_{WE}$ are driven to "high" levels, an active cycle is set.

When the first bank is selected during the MRS cycle and the bank select bit B input during the active cycle is "low", the row and column decoding means 34 and 40 of FIG. 2 are activated by the redundancy control signal RED. Thus, the normal cell 50 of the first bank is selected. When the first bank is selected during the MRS cycle and the bank select bit B input during the active cycle is "high", the redundancy row and redundancy column decoding means 36 and 42 are activated by the redundant control signal RED. Thus, the redundant cells 52 and 54 of the first bank are selected.

When the second bank is selected during the MRS cycle and the bank select bit B input during the active cycle is "low", the redundancy row and redundancy column decoding means 36 and 42 are activated. Thus, the redundant cells 58 and 60 of the second bank are selected. When the second bank is selected during the MRS cycle and the bank select bit B input during the active cycle is "high", the row and column decoding means 34 and 40 are activated by the redundancy control signal RED. Thus, the normal cell 56 of the second bank is selected.

Therefore, the semiconductor memory device of the present invention has an advantage in that the normal or redundant cells are sequentially selected by using the same input pad A13 used for bank selection.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A semiconductor memory device comprising:
   a first and second memory bank each having a normal cell array and an associated redundant cell array;
   a decoder circuit addressing one of the first and second memory banks and the redundant cell array for the nonaddressed one of the memory banks in response to a bank select signal generated from an external address; and
   a test mode determining means coupled to the decoder circuit for generating a test mode signal in response to the external address and one or more memory device control signals,
   the test mode signal in combination with the bank select signal activating one of the normal and redundant cell arrays for the addressed memory bank among the plurality of banks allowing testing of both the normal cell array and redundant cell array using the same external address.

2. A semiconductor memory device as claimed in claim 1 wherein the test mode determining means includes latching circuitry that selectively switches back and forth between activating the normal and redundant cell array for the addressed memory bank.

3. A semiconductor memory device as claimed in claim 2 wherein the decoder circuitry includes the following:
   a normal predecoder receiving the external address;
   a normal decoder receiving an output of the normal predecoder and the test node signal for selectively activating a memory cell in the normal cell array;
   a redundancy row fuse box receiving the external address; and
   a redundancy row decoder receiving an output of the redundancy row fuse box and the test signal for selectively activating a memory cell in the redundancy cell array.

4. A semiconductor memory device as claimed in claim 1 wherein the test mode determining means comprises:
   a first transferring circuit for transferring the address in response to a first one of the control signals;
   a first latch for storing a signal transferred by the first transferring circuit;
   a first inverting circuit for inverting an output signal of the first latch;
   a second transferring circuit transferring an output signal of the first inverting circuit in response to a second one of the control signals;
   a second latch for storing the signal transferred by the second transferring circuit;
   a second inverting circuit for inverting an output signal of the second latch and outputting the test mode signal;
   a first precharge circuit for precharging an input terminal of the first latch; and
   a second precharge circuit for precharging an input terminal of the second latch.

5. A semiconductor memory device having a plurality of banks each including normal and redundant cell arrays, the semiconductor memory device comprising:
   a row decoder for addressing rows in the normal cell arrays and a redundant row decoder for addressing rows in the redundant cell arrays, one of the row decoder and redundant row decoder activated in response to a redundancy control signal in combination with a bank select signal generated from an external address;
   a column decoder for addressing columns in the normal cell arrays and a redundant column decoder for addressing columns in the redundant cell arrays, one of the column decoder and redundant column decoder activated in response to the redundancy control signal in combination with the bank select signal;
   a test mode circuit generating a test mode signal in response to memory device control signals and the external address signals, the test mode signal used in combination with the bank select signals for and
   generating the redundancy control signal so that the same external address is used for addressing one of the plurality of banks and also testing both the normal cell arrays and redundant cell arrays in the addressed bank.

6. A semiconductor memory device as claimed in claim 5 wherein the redundancy control signal is selectively latched on and off by the test mode circuit thereby selectively switching back and forth between activating the normal and redundant cell arrays using the same external address.

7. A semiconductor memory device as claimed in claim 6 wherein the redundancy control signal is selectively latched on and off according to a chip select signal, a column address strobe signal, and a write enable signal.

8. A semiconductor memory device as claimed in claim 5 wherein the test mode circuit comprises:
   a switching circuit for selectively transferring the address in response to the first control signal; and
   a latch for storing a signal transferred by the switching circuit.

9. The semiconductor memory device according to claim 5 wherein the row decoder, redundant row decoder, column decoder and redundant column decoder in combination select the normal cell array for a first one of the memory banks and select the redundant cell array for a second one of the memory banks when the bank select signal is asserted and select the redundant cell array for the first one of the memory banks and select the normal cell array for the second one of the memory banks when the bank select signal is deasserted.

10. A method for activating cells in a semiconductor memory device with multiple banks each having a normal cell array and a redundant cell array, comprising:
   initiating a mode register set cycle by asserting a first combination of control signals in the memory device;
   selecting one of the multiple banks during the mode register set cycle according to a bank select signal generated from an external address;
   setting the selected one of the banks and starting active cycle by asserting a second combination of the control signals;

generating a test mode signal during the active cycle according to the bank select signal and the memory control signals; and selectively switching between activating one of the normal cell array and redundant cell array for the selected bank during the active cycle by asserting and deasserting the test mode signal there using the same external address for both selecting one of the multiple banks and selectively enabling testing of the normal cell array and the redundant cell array for the selected one of the multiple banks.

11. A method according to claim 10 including selecting the normal cell array for a first one of the memory banks and selecting the redundant cell array for a second one of the memory banks when the bank select signal is asserted and selecting the redundant cell array for the first one of the memory banks and selecting the normal cell array for the second one of the memory banks when the bank select signal is deasserted.

* * * * *

UNITED STATES PATENT AND TRADEMARK OFFICE
CERTIFICATE OF CORRECTION

PATENT NO.     : 5,808,948
DATED          : September 15, 1998
INVENTOR(S)    : Kim et al.

It is certified that error appears in the above-identified patent and that said Letters Patent is hereby corrected as shown below:

Column 4,
Line 21, "14" should read -- I4 --;
Line 23, "17" should read -- I7 --;

Column 6,
Lines 26-27, "for and ¶ generating" should read -- for generating --;

Column 7,
Line 7, "there" should read -- thereby --.

Signed and Sealed this

Eleventh Day of February, 2003

JAMES E. ROGAN
*Director of the United States Patent and Trademark Office*